(12) United States Patent
Schweikard et al.

(10) Patent No.: US 6,788,062 B2
(45) Date of Patent: Sep. 7, 2004

(54) CORRECTING GEOMETRY AND INTENSITY DISTORTIONS IN MR DATA

(75) Inventors: Achim Schweikard, Hamburg (DE); Stefan Burkhardt, Munich (DE)

(73) Assignee: Stryker Leibinger GmbH & Co., KG, Freiburg (DE)

(*) Notice: Subject to any disclaimer, the term of this patent is extended or adjusted under 35 U.S.C. 154(b) by 0 days.

(21) Appl. No.: 10/606,068

(22) Filed: Jun. 25, 2003

(65) Prior Publication Data

US 2004/0032261 A1 Feb. 19, 2004

(30) Foreign Application Priority Data

Jul. 25, 2002 (EP) .............................. 02016346

(51) Int. Cl.[7] .................................................. G01V 3/00
(52) U.S. Cl. ....................................... 324/321; 324/318
(58) Field of Search ................................ 324/321, 319, 324/318, 309, 307; 600/407; 128/653

(56) References Cited

U.S. PATENT DOCUMENTS

| 4,270,545 | A | * | 6/1981 | Rodler | ........................ | 600/407 |
| 4,436,684 | A | * | 3/1984 | White | .......................... | 264/138 |
| 4,969,469 | A | | 11/1990 | Mills | ............................ | 128/653 |

FOREIGN PATENT DOCUMENTS

EP    1 385 018 A1 * 1/2004

OTHER PUBLICATIONS

Posse et al., "Susceptibility Artifacts in Spin–Echo and Gradient–Echo Imaging" *Journal of Magnetic Resonance*, vol. 88, No. 3, pp. 473–492, Jul. 1, 1990.

Balac et al., "Integral Method for Numerical Simulation of MRI Artifacts Induced by Metallic Implants" *Magnetic Resonance in Medicine*, vol. 45, No. 4, pp. 724–727, Apr. 2001.

Balac et al., "Magnetic Susceptibility Artifacts in Magnetic Resonance Imaging: Calculation of the Magnetic Field Disturbances" *IEEE Transactions on Magnetics*, vol. 32, No. 3, pp. 1645–1648, May 1996.

Bhagwandien, Ramesh "Object Induced Geometry and Intensity Distortions in Magnetic Resonance Imaging" *Internet Article XP–002224096*, pp. 1–2, Nov. 15, 2000.

European Search Report, Application EP 02 01 6346 dated, Dec. 9, 2002.

* cited by examiner

*Primary Examiner*—Brij B. Shrivastav
(74) *Attorney, Agent, or Firm*—McCracken & Frank LLP

(57) ABSTRACT

A method of correcting distortions in magnetic resonance (MR) data is described. The method comprises providing distorted MR data of an object of interest and distortion parameters for one or more generic objects, determining transformation parameters correlating the object of interest and one or more of the generic objects, and processing the distorted MR data taking into account the distortion parameters and the transformation parameters to obtain corrected MR data.

18 Claims, 7 Drawing Sheets

CORRECTING GEOMETRY AND INTENSITY DISTORTIONS IN MR DATA

BACKGROUND OF THE INVENTION

1. Technical Field

The invention relates to the field of Magnetic Resonance Imaging (MRI). In particular, the invention relates to a method, a computer program product and an apparatus which allow the correction of geometrical and intensity distortions inherent in Magnetic Resonance (MR) data.

2. Description of the Prior Art

MRI is a powerful technology for acquiring images with high tissue contrast. Besides the high tissue contrast, the potential for tumor localization and the possibility to scan in any plane orientation have made MRI a useful tool in many fields of medicine.

MRI relies on the principle that an arbitrary object of interest is magnetized by a strong and homogenous static magnetic field $B_0$. The homogeneity of the static magnetic field $B_0$ is a very important aspect of MRI because any perturbations of the homogeneity lead to geometry and intensity distortions in the image plane as well as to displacement, warp and tilt of the image plane itself.

In reality, the static magnetic field $B_0$ is never homogeneous but perturbed. One reason for perturbations of the magnetic field $B_0$ is the object of interest itself which is placed in the magnetic field $B_0$.

When an object having a specific magnetic susceptibility distribution $\chi(x)$ is placed in the homogeneous and static magnetic field $B_0$, the object becomes magnetized and the homogenous static magnetic field $B_0$ is distorted giving rise to an induced magnetic field B. For an analysis of the geometry and intensity distortions caused by an object placed in the homogeneous static magnetic field $B_0$, the field B has to be determined.

In order to determine B, the Maxwell equations have to be solved. For a magnetostatic problem the Maxwell equations reduce to the Laplace equation $$\mathrm{div}(\mu \Delta \Phi_M) = 0. \quad (1)$$

Here $\Phi_M$ is the magnetic scalar potential in [Wb/m] and $\mu = 1 + \chi$ is the dimensionless magnetic permeability. If the susceptibility distribution $\chi(x)$ of an object is known, $\Phi_M$ is determined by solving equation (1). From $\Phi_M$ the magnetic field H in [H/m]

$$H = -\nabla \Phi_M \quad (2)$$

and the induced magnetic field B in [T]

$$B = \mu_0 \mu H \quad (3)$$

can be deduced. $\mu_0$ denotes the permeability of vacuum and has a value of $\mu_0 = 4\pi \times 10^{-7}$ H/m.

Equation (1) can be solved analytically for very simple objects such as cylinders and spheres. For more complex objects equation (1) can be solved only numerically. An exemplary numerical analysis of the magnetic field B for arbitrary magnetic susceptibility distributions $\chi(x)$ in two and three dimensions is discussed in R. Bhagwandien: "Object Induced Geometry and Intensity Distortions in Magnetic Resonance Imaging", PhD thesis, Universiteit Utrecht, Faculteit Geneeskunde, 1994, ISBN: 90-393-0783-0.

Susceptibility related distortions in MRI are usually in the millimeter range and have therefore no influence on diagnostic applications. However, in certain applications like Radio Therapy Planning (RTP) the geometric accuracy of an MR image is of high importance because accurate beam positioning is essential for optimal tumor coverage and sparing healthy tissues surrounding the tumor as much as possible.

Based on a numerical solution of equation (1), various methods have been proposed to reduce susceptibility induced distortions in MR images.

In the Bhagwandien document a correction method is described which is based on just one image, namely the distorted MR image. According to this correction method, the distorted MR image is first converted into a magnetic susceptibility distribution by segmenting the MR image into air and water equivalent tissue. In a next step the susceptibility distribution thus obtained is used to numerically calculate the field B. Finally, the corrected MR image is calculated on the basis of a read out gradient that is reversed with respect to the read out gradient used to acquire the distorted MR image. If for example a gradient field of a specific strength $G_z$ has been applied during acquisition of the distorted MR image to define the image plane in z-direction, the corrected MR image is calculated for a gradient field of the strength $-G_z$.

A major draw back of all methods hitherto used to correct distortions in MR data is the computational complexity involved in generating corrected MR data. Consequently, there is a need for a method, a computer program product and an apparatus for correcting distortions in MR data faster.

SUMMARY OF THE INVENTION

This need is satisfied according to the invention by a method of correcting distortions in MR data, the method comprising the steps of providing distorted MR data of an object of interest and distortion parameters for one or more generic objects, determining transformation parameters correlating the object of interest and one or more of the generic objects, and processing the distorted MR data taking into account the distortion parameters and the transformation parameters to obtain corrected MR data.

By using generic distortion parameters, i.e. distortion parameters derived for generic objects, the corrected MR data for the object of interest can be generated faster. The reason for this is the fact that the Laplace equation (1) has not necessarily to be solved individually for every set of distorted MR data.

The distortion parameters for a particular generic object may be determined in various ways. The distortion parameters for a particular generic object may for example be derived from magnetic field inhomogenities which result from the specific magnetic susceptibility distribution of this particular generic object when the object is placed in a homogeneous static magnetic field. According to a first variant, the magnetic field inhomogenities caused by the generic object are determined by way of measurements. According to a second variant, the magnetic field inhomogenities are derived by way of calculations from distorted MR data of the generic object, i.e. from distorted generic MR data.

Preferably, the magnetic field inhomogenities, i.e. the distortion parameters, are derived from distorted generic MR data. Generic MR data may be obtained for e.g. a specific part of the human body from commercial databases. However, the generic MR data may also be generated using available generic objects during a data acquisition phase preceding the actual acquisition of the distorted MR data of the object of interest.

Deriving the magnetic field inhomogenities from generic MR data may include two separate steps. In a first step the magnetic susceptibility distribution of the generic object may be determined from the distorted generic MR data. To that end an image generated on the basis of the distorted generic MR data may be segmented automatically or manually to obtain areas of common or similar magnetic susceptibility. Then, an appropriate susceptibility value may be automatically or manually assigned to each area having the same or a similar magnetic susceptibility.

Once the magnetic susceptibility distribution of the generic object has been determined, the magnetic field inhomogenities are derived from the determined susceptibility distribution in a second step. The second step may include a numerical approach in order to solve the Laplace equation (1) for the determined susceptibility distribution. The numerical approach may for example be based oh transforming the Laplace equation (1) into a diffusion equation and on solving this diffusion equation by means of a diffusion technique. Preferably, however, a multi-grid approach is used to solve the Laplace equation (1) for the determined susceptibility distribution. By means of a multi-grid algorithm the computational complexity is reduced since the iterations that normally take place on a fine grid are replaced by iterations on a coarser grid.

The multi-grid approach is not restricted to solving the Laplace equation (1) in context with determining the distortion parameters for a generic object but can directly be applied to correct distortions in MR data "on-line". According to this "on-line" aspect of the invention, the distorted MR data of the object of interest are first converted into a magnetic susceptibility distribution and the susceptibility distribution thus obtained is used to numerically calculate (using the multi-grid approach) the magnetic field B induced by the object of interest. The corrected MR data of this object may then be calculated on the basis of a read out gradient (i.e. gradient field strength) that is reversed with respect to the read out gradient used to acquire the distorted MR data of the object of interest.

In the course of correcting the distorted MR data of the object of interest a correlation between the object of interest and one or more of the generic objects has to be established. To this end transformation parameters indicative of the correlation are determined. The transformation parameters indicate how the object of interest will be deformed during a mapping operation on the one or more generic objects or how the one or more generic objects will be deformed during a mapping operation on the object of interest. Preferably, the transformation parameters are determined for specific points, contours, areas or other features which the object of interest and the one or more generic objects have in common.

The transformation parameters may be determined on the basis of magnetic susceptibility data of the object of interest and of the one or more generic objects. Preferably, the magnetic susceptibility data are derived from distorted MR data by e.g. segmenting the distorted MR data into regions of changing magnetic susceptibility (magnetic susceptibility contours) or regions (areas) of common or similar magnetic susceptibility. After the distorted MR data of the object of Interest have been segmented, transformation parameters are derived which deform at least one segmented region (e.g. a specific area or a specific contour) determined from the distorted MR data of the object of interest onto a corresponding region of one or more of the generic object or vice versa.

Once appropriate transformation parameters have been determined, the distorted MR data of the object of interest are corrected. To that end, the distortion parameters for the one or more generic objects and the transformation parameters may be used for calculating distortion parameters for the object of interest. Since the calculation of the distortion parameters for the object of interest involves a mere correlation of the distortion parameters for the one or more generic objects and the transformation parameters, no differential equation has to be solved. The distortion parameters for the object of interest can thus be obtained in a fast and easy manner. Once the distortion parameters for the object of interest are known, they may be reverse-applied to the distorted MR data of the object of interest or to data derived therefrom to obtain corrected MR data.

For a particular generic object several sets of distortion parameters may be provided for different gradient field strengths, different phase encoded directions, etc. This enables to select the set of distortion parameters that corresponds with respect to gradient field strength, phase encoded direction, etc. to the gradient field strength, phase encoded direction, etc. used while generating the distorted MR data of the object of interest.

MR data of a phantom object may be co-generated with the distorted MR data of the object of interest. By using a phantom object like a sphere or a cylinder with known characteristics it is possible to estimate the gradient field strength that was used while generating the distorted MR data of the object of Interest. As has been mentioned above, knowledge of the gradient field strength used while generating the distorted MR data of the object of interest is of importance e.g. if generic distortion parameters for different gradient field strengths are available.

Moreover, MR data of a phantom object co-generated with the distorted MR data of the object of interest allow to redundantly verify the correction of the distorted MR data. If for example the relationship between distorted and corrected MR data of the phantom object is known, this relationship may be compared to the relationship between the distorted and the corrected MR data of the object of interest. By comparing the two relationships a quality parameter for the corrected MR data of the object of interest can be derived.

Since the invention allows to correct geometry and intensity distortions in a fast and reliable manner, it is advantageous to repeatedly acquire and correct distorted MR data of the object of interest at different points in time. Due to the high reliability of the corrected MR data, chronological changes of the object of interest can be assessed. This enables for example to detect tumor growth in the sub-millimeter range. For this purpose MR data generated for one and the same object of interest at different points in time may be registered relative to each other. In the case of MR image data, the registration might result in a spatial superposition of the individual sets of MR image data.

According to a preferred aspect of the invention the corrected MR data of the object of interest are combined with Computer Tomography (CT) or fluoroscopic data of the object of interest to profit from the individual advantages of each imaging technology. For example the CT or fluoroscopic data and the corrected MR data of the object of interest may be registered relative to each other and the registered data may be used for generating an image showing a combination of the structures of the object of interest that were detected by MR on the one hand and by e.g. CT on the other hand.

Preferably, the corrected MR data or data derived therefrom like CT or fluoroscopic data registered with the corrected MR data are used for generating a graphical display for example on a display device of a computer system. The corrected MR data or the data derived therefrom may then be used for navigating a chirurgical tool or a pointer during e.g. bone surgery. To that end, an infrastructure may be provided which allows to determine on-line the current position of at least one of the surgical tool and the pointer with respect to the corrected MR data or the data derived therefrom. By superimposing the current position of at least one of the surgical tool and the pointer on the graphical display of the corrected MR data or the data derived therefrom a navigation aid for the surgical tool or the pointer is achieved. In the context of navigating a surgical tool or a pointer the fact that geometry and intensity distortions in the MR data of the object of interest have been corrected is of high importance because otherwise an exact navigation would not be possible.

The method according to the invention can be implemented as a hardware solution and as a computer program product comprising program code portions for performing the individual steps of the method when the computer program product is run on a computer. The computer program product may be stored on a computer readable recording medium like a data carrier attached to or removable from the computer.

The hardware solution includes an apparatus comprising a common database or separate databases for at least temporarily storing distorted MR data of the object of interest and distortion parameters determined for one or more generic objects, a transformation parameter generator for generating transformation parameters correlating the object of interest and one or more of the generic objects, and a generator for corrected MR data for processing the distorted MR data taking into account the distortion parameters and the transformation parameters to obtain corrected MR data for the object of interest. Preferably, the apparatus is part of a navigational infrastructure for computer aided surgery.

BRIEF DESCRIPTION OF THE DRAWINGS

Further aspects of the invention will become apparent from the following description of various embodiments of the invention and upon reference to the drawings, in which.

DESCRIPTION OF PREFERRED EMBODIMENTS

In the following, the invention will exemplarily be set forth with respect to correcting distorted MR image data in context with tumor diagnosis and bone surgery. It should be noted, however, that the invention could be implemented in any technical field like material sciences requiring the generation of highly accurate MR data.

Hardware Aspects

Figure 1:
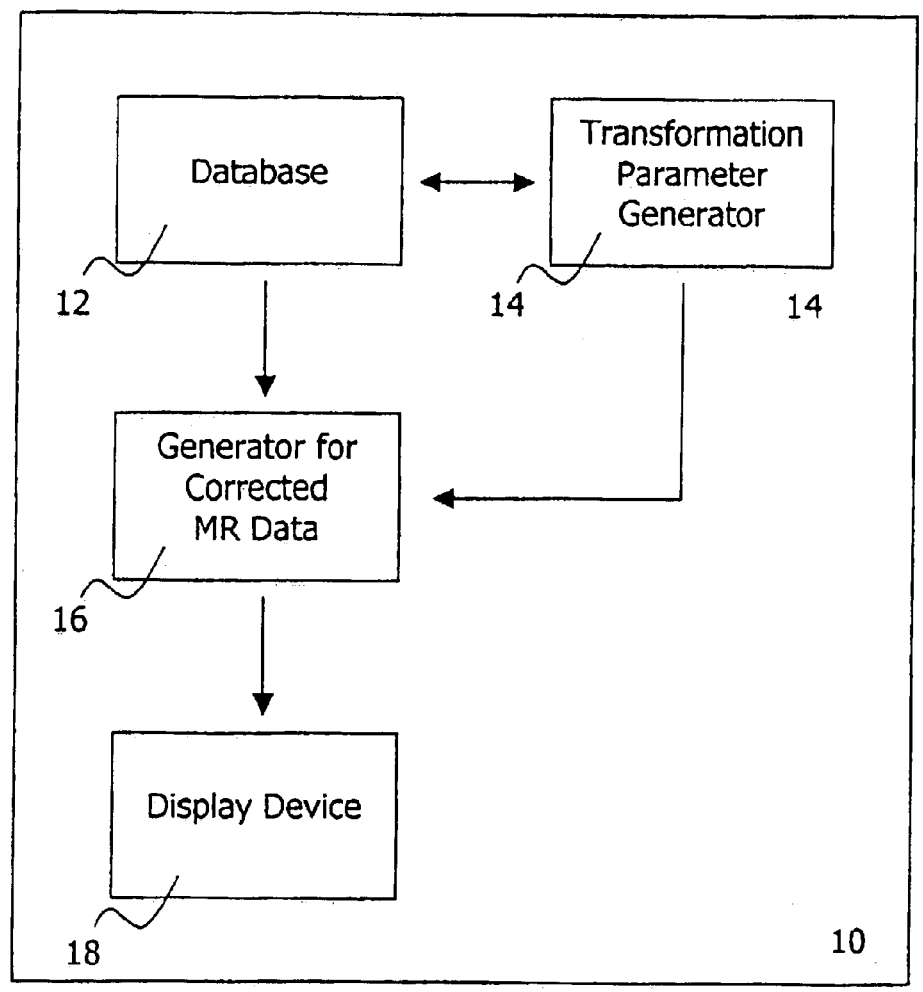
FIG. 1 is a schematic diagram of an apparatus according to the invention for correcting distortions in MR data.
Figure 2:
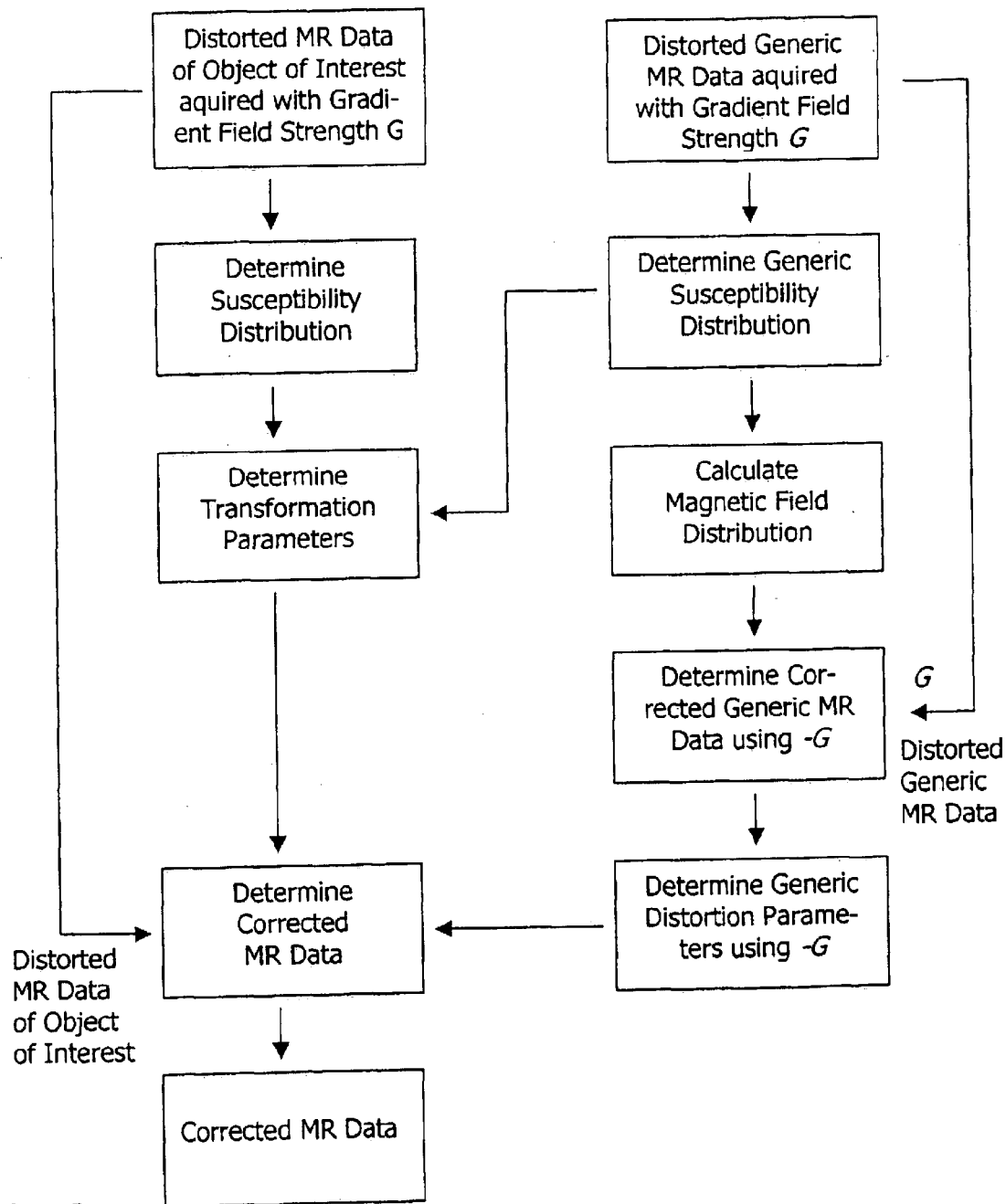
FIG. 2 is a block diagram depicting the steps performed according to the invention during the correction of distorted MR data.

In FIG. 1 an apparatus 10 according to the invention for correcting distortions in MR data is depicted. The apparatus 10 may for example be configured as a computer terminal and comprises a database 12 for storing newly acquired distorted MR data of an object of interest like a patient's head. Additionally, a plurality of sets of generic distortion parameters which have previously been generated as will be discussed below with reference to FIG. 2 are stored in the database 12. Furthermore, for each set of generic distortion parameters and/or each generic object an individual generic susceptibility distribution is stored in the database 12.

A transformation parameter generator 14 of the apparatus 10 is configured such that it has access to the database 12 and in particular to the distorted MR data of the object of interest and the generic susceptibility distributions stored therein. The transformation parameter generator 14 is capable of determining the susceptibility distribution of the object of interest and of selecting the susceptibility distribution of this generic object which matches the object of interest best. By correlating the susceptibility distribution of the object of interest and the selected generic susceptibility distribution, the transformation parameter generator 14 determines a set of transformation parameters which are output to a generator 16 for corrected MR data.

The generator 16 for corrected MR data is configured to access the database 12 and to read out the distorted MR data of the object of interest and the generic distortion parameters corresponding to the particular generic susceptibility distribution selected by the transformation parameter generator 14. Taking into account the transformation parameters determined by the transformation parameter generator 14 and the specific generic distortion parameters obtained from the database 12, the generator 16 for corrected MR data processes the distorted MR data of the object of interest to generate corrected MR data of the object of interest as will be explained below in more detail.

The corrected MR data of the object of interest determined by the generator 16 are output to a display device 18 which transforms the received MR data into corresponding image data and generates a graphical display of the corrected MR data of the object of interest.

In the following, the individual steps performed according to the invention during the correction of distorted MR data of an object of interest are explained in more detail with reference to FIGS. 2 to 7.

Generation of Input Data

Referring to FIG. 2, a first set of input data is constituted by newly acquired distorted MR data of an object of interest, e.g. a patient's head. The distorted MR data of the object of interest are acquired using an MR scanner as is known in the art. Besides the distorted MR data of the object of interest, the gradient field strength and the phase encoded direction employed during the data acquisition process for the object of interest are stored at least temporarily also.

In addition to the distorted MR data of the object of interest, a plurality of distorted is generic MR data for several different generic objects are provided. For each generic object, several sets of generic MR data acquired at different gradient field strengths and phase encoded directions may be available.

The individual sets of generic MR data can for example be obtained from a commercially available anatomical atlas of from specific databases. In principle, the sets of distorted generic MR data may also have been generated by the MR scanner which is used to acquire the distorted MR data of the object of interest.

Each set of generic MR data comprises a DICOM header which contains information about the gradient field strength and the phase encoded direction employed during the acquisition of the specific generic MR data.

Determination of the Susceptibility Distributions

The distorted MR data of the object of interest and the individual sets of distorted generic MF data are processed to determine the magnetic susceptibility distribution of the object of interest and the generic objects, respectively.

Usually, processing of the sets of generic MR data will have taken place prior to the acquisition of the distorted MR data of the object of interest. In other words, there may be several sets of generic susceptibility distribution data already readily available (e.g. stored in the database 12 of the apparatus 10 depicted in FIG. 1) when the correction of the distorted MR data of the object of interest is started.

The process of determining the magnetic susceptibility distribution is the same for the distorted MR data of the object of interest and the distorted generic MR data. During the step of determining the magnetic susceptibility distribution, an MR image corresponding to the MR data is generated and manually or automatically segmented into areas corresponding to air and areas corresponding to different tissues like bone, muscle and fat. This might involve a determination of the outer contour of the individual object After the segmentation step, each individual segment is assigned an appropriate magnetic susceptibility. The magnetic susceptibilities is of materials like human tissue are well known.

Determination of Transformation Parameters

The determination of the transformation parameters starts with selecting the generic susceptibility distribution of this generic object which matches the object of interest best. If the object of interest is e.g. a patient's head, the generic susceptibility distribution of a generic patient's head having the same size or diameter can be selected. Additionally, a patient's sex, age, etc. can be taken into account. Thus, the generic object which matches best the object of interest has to be determined.

Since for each generic object distorted MR data acquired at different gradient field strengths and phase encoded directions may be available, this particular generic susceptibility distribution is selected which corresponds with respect to gradient field strength and phase encoded direction to the distorted MR data of the object of interest.

Once an appropriate generic susceptibility distribution has been selected, the generation of the transformation parameters continues with marking or segmenting prominent points, contours or areas in the susceptibility distribution of the object of interest. The selected generic susceptibility distribution is subjected to a similar processing to identify the prominent point, contours and areas which are to be associated with the corresponding features of the susceptibility distribution of the object of interest.

On the prominent points, contours or areas of both the susceptibility distribution of the object of interest and a selected generic susceptibility distribution control points are set. By means of an optimization procedure a deformation for one of the two distributions is then determined which minimizes the distance between the corresponding control points of each distribution. To this end thin-plate splines, bilinear interpolation, deformation procedures based on Gauss' least square optimization or any similar deformation procedures or combinations thereof may be used.

According to an alternative approach, the deformation is performed without any control points. In such a case the respective grey value or color value distribution of images corresponding to the individual susceptibility distributions are used. The matching between two corresponding susceptibility distributions can be assessed after an iteratively performed deformation step by means of procedures of mutual information, cross correlation procedures or similar procedures or combinations thereof. The optimization of a deformation is thus based on a rating function which measures the degree of matching between two images.

Once an optimum deformation has been found by any of the procedures mentioned above, the corresponding transformation parameters can be determined by assessing the deformation required to map the susceptibility distribution of the object of interest onto the corresponding generic susceptibility distribution. It should be noted that deviating from the steps mentioned above the transformation parameters may also be derived directly from a distorted MR image of the object of interest and the generic MR image of an appropriate generic object which have been acquired at a similar field strength and phase encoded direction.

Determination of the Generic Distortion Parameters

The determination of the generic distortion parameters starts with the calculation of the magnetic field B associated with the selected generic susceptibility distribution. To that end the Laplace equation (1) has to be solved. Before equation (1) can numerically be solved it has to be transposed to a finite difference equation. After that it can be solved using iterative approaches (e.g. Jacobi or Gauss-Seidel iterations) or a multi-grid algorithm.

Resolving of the equation (1) with substitution of the div-and ∇-operators leads to the equation $$\frac{\partial^2 \Phi_M}{\partial x^2} + \frac{\partial^2 \Phi_M}{\partial y^2} + \frac{\partial^2 \Phi_M}{\partial z^2} + \frac{1}{\mu}\frac{\partial \mu}{\partial x}\frac{\partial \Phi_M}{\partial x} + \frac{1}{\mu}\frac{\partial \mu}{\partial y}\frac{\partial \Phi_M}{\partial y} + \frac{1}{\mu}\frac{\partial \mu}{\partial z}\frac{\partial \Phi_M}{\partial z} = 0 \quad (4)$$

Equation (4) is a partial difference equation of elliptic type. The solution of this equation is restricted to the grid points which are given by the MR data, i.e. the MR image. These points are $$x_i = x_0 + i \cdot \Delta_x, \quad (5)$$

$$y_j = y_0 + j \cdot \Delta_y, \quad (6)$$

$$z_k = z_0 + k \cdot \Delta_z. \quad (7)$$

$\Delta_x, \Delta_y, \Delta_z$ denote the grid width in x-, y- and z-direction. The values of $\Phi_M$ will only be computed at these points.

Resolving equation (4) while restricting the solution to the above grid points leads to $$\frac{\Phi_{i-1,j,k} - 2\Phi_{i,j,k} + \Phi_{i+1,j,k}}{\Delta_x^2} + \frac{\Phi_{i,j-1,k} - 2\Phi_{i,j,k} + \Phi_{i,j+1,k}}{\Delta_y^2} + \qquad (8)$$

$$\frac{\Phi_{i,j,k-1} - 2\Phi_{i,j,k} + \Phi_{i,j,k+1}}{\Delta_z^2} + a\frac{\Phi_{i+1,j,k} - \Phi_{i,j,k}}{\Delta_x} +$$

$$b\frac{\Phi_{i,j+1,k} - \Phi_{i,j,k}}{\Delta_y} + c\frac{\Phi_{i,j,k+1} - \Phi_{i,j,k}}{\Delta_z} = 0$$

The value $\Phi_{i,j,k}$ of boundary voxels is given. a, b and c represent the values of the partial derivates of $\mu$ which are calculated using a difference scheme:

$$a = \frac{1}{\mu}\frac{\mu_{i+1,j,k} - \mu_{i,j,k}}{\Delta_x} \qquad (9)$$

$$b = \frac{1}{\mu}\frac{\mu_{i,j+1,k} - \mu_{i,j,k}}{\Delta_y}$$

$$c = \frac{1}{\mu}\frac{\mu_{i,j,k+1} - \mu_{i,j,k}}{\Delta_z}$$

Equation (8) can be solved iteratively using e.g. a Jacobi or Gauss-Seidel scheme, but usually these methods take a large number of iterations to converge. If only Jacobi- or Gauss-Seidel iterations were used to solve for the equation, the approach would be very slow for large data amounts, i.e. large images.

One may also solve equation (8) using a multi-grid algorithm. Thus, computational complexity may be reduced by replacing the iterations that would normally take place on a fine grid by iterations on a coarser grid. This has the advantage that the time complexity is only linear with respect to the number of observed grid points. In this section it will be briefly reviewed how Gauss-Seidel iterations are performed and used within a multi-grid algorithm.

Equation (8) can be written in terms of a matrix equation $$A\Phi = f \qquad (10)$$

where A denotes the coefficients, $\Phi$ the values of $\Phi_{i,j,k}$ and f the right side of equation (10) stacked in vector form (in this case f=0).

A is decomposed such that A=D−L−R, where D is diagonal, L is lower triangular and R is upper triangular. Now the Gauss-Seidel iteration is given by $$\Phi^{(i+1)} = (D-L)^{+1}(f+R\Phi^{(i)}) \qquad (11)$$

with any initial value $\Phi^{(0)}$.

The basis of the multi-grid algorithm is the coarse grid correction scheme, where an approximate solution is refined by solving for the error on a coarse grid and updating it with the error.

After i Gauss-Seidel iterations one gets an approximate solution $\Phi^{(i)}$ for the equation. The remaining error is defined as $$e = \Phi - \Phi^{(i)} \qquad (12)$$

and the residual r is given by $$r = f - A\Phi^{(i)}. \qquad (13)$$

Then the error satisfies the equation $$Ae = r \qquad (14)$$

which can be solved by Jacobi or Gauss-Seidel iterations too. However, this equation will be solved approximately on a grid with a coarser resolution. Therefore two operators are defined, a restriction operator R which transforms the residual from high resolution representation to a representation with half the resolution along each axis and a prolongation operator P which moves from low to high resolution. The restriction operation is performed by an averaging which replaces every 27 voxel neighborhood by its weighted mean. The central value is weighted by ½ and the values of all the 6-neighbors by 1/12. The prolongation is simply performed by a trilinear interpolation.

Figure 3:
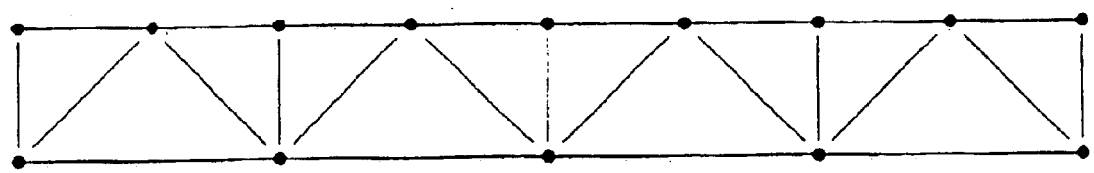
FIG. 3 schematically shows a correlation between fine and coarse grids performed by a multi-grid algorithm according to the invention.

The correlation between fine and coarse grids is shown in FIG. 3 for a one-dimensional problem. The step from a fine to a coarser grid is performed by weighted averaging of every three-voxel neighborhood in three dimensions. To get to a finer grid, the value of every second voxel is determined by means of linear interpolation.

The above leads to the multi-grid algorithm proposed here:
1. Starting with $\Phi^{(0)}$ perform $i_1$ Gauss-Seidel iterations for solving the equation $A\Phi = f$ to obtain an approximate solution $\Phi^{(i)}$.
2. Compute the residual $r = f - A\Phi^{(i)}$.
3. Restrict the residual to coarse grid $r' = R(r)$.
4. Solve for error equation $A'e' = r'$ on coarse grid.
5. Prolongation of the error to high resolution $e = P(e')$.
6. Correct the fine grid approximate solution by the error $\Phi^{(i+1)} = \Phi^{(i)} + e$.
7. Perform $i_2$ fine grid iterations starting with $\Phi^{(i+1)}$.

A V-cycle is a recursion of the coarse grid correction upon itself to coarser grid. In other words, the error equation has its own error which can be solved using an embedded coarse grid correction. This is repeated for multiple resolutions. A W-cycle consists of two recursions of the coarse grid correction which means that once after step 6 it is continued with step 1 and use of $\Phi^{(i+1)}$ instead of $\Phi^{(0)}$.

To solve for the magnetic scalar potential, one W-cycle is applied with $i_1 = 5$ and $i_2 = 10$. The images are extended to a size of $(2^k + 1) \times (2l + 1) \times (2^m + 1)$. The coarsest grid used is the finest grid which contains less than 10000 voxels. On this grid size as many iterations are performed as needed for achieving convergence.

Now a possible implementation of the multi-grid algorithm will be discussed.

Figure 4:
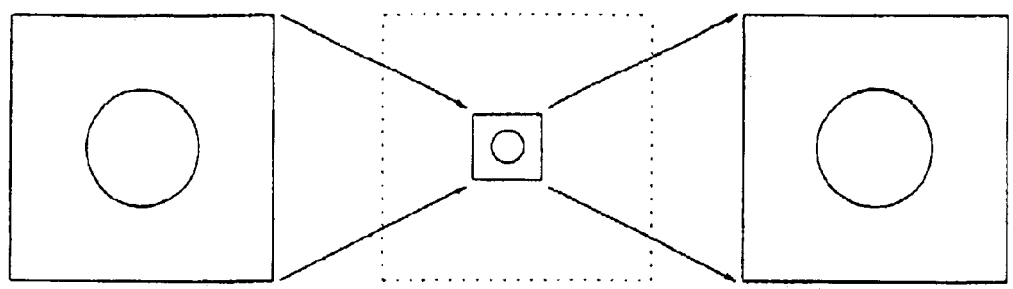
FIG. 4 schematically shows the procedure used to calculate $\Phi_M$.

To solve for the boundary value problem, it is necessary to specify the value of $\Phi_M$ at boundary voxels. This is performed in two steps. A graphical representation of the procedure used for calculating $\Phi_M$ is given in FIG. 4. On the left side of FIG. 4, the original image of the object for which the susceptibility distribution is known is depicted. The imaged object was put in a larger environment and sampled down as indicated by the arrows. Then $\Phi_M$ is calculated for this sampled down image. In a subsequent step, the boundary values from the image depicted in the middle of FIG. 4 are expanded as is shown on the right side of FIG. 4. For this expanded image the $\Phi_M$ distribution is calculated next.

In the context of the procedure shown in FIG. 4, a scale factor f is determined. An object is placed in an area enlarged by a factor of f and scaled down by a factor f The result is an image of the same size as the original but with a smaller imaged object f should be chosen so that the object does not have any influence on the magnetic field at the borders of the new image. One may choose e.g. f=4 because it can be assumed that the imaged object has no influence on the magnetic field at the borders of this environment.

Now the values of $\Phi_M$ are determined for the boundary. Assume the image has $n_x = 2^k + 1$ rows $\{0, \ldots, 2^k\}$, $n_y = 2^l + 1$ columns $\{0, \ldots, 2^l\}$ and $n_z = 2^m + 1$ slices $\{0, \ldots, 2^m\}$. The scalar magnetic potential $\Phi_M$ if the main magnetic field $B_0$ were undisturbed is determined by $$\Phi_M(x, y, z) = \frac{f}{2\mu_0} B_0((2^{k-1} - x)\Delta_x e_x + (2^{l-1} - y)\Delta_y e_y + (2^{m-1} - z)\Delta_z e_z) \quad (15)$$

with the unit vectors $e_x$, $e_y$, $e_z$. Although the magnetic field is disturbed one may use this equation for computing the values of $\Phi_M$ at boundary voxels. Note that $\Phi_M$ is determined except for an additive constant which is chosen so that $\Phi_M=0$ in the center of the image.

After computing the $\Phi_M$ distribution for the large image the values at positions corresponding to the boundaries in the original image are copied to their respective positions. The distribution is now computed in the original image.

In the next steps the H field is calculated from the $\Phi_M$ field (equation (2)) with the central difference scheme and the B field is calculated from the H field (equation(3)) thus obtained.

On the basis of the distorted generic MR data and the calculated distribution of the magnetic field B, corrected generic MR data are calculated using a read out gradient having a gradient field strength-G that is reversed with respect to the gradient field strength G used to acquire the distorted generic MR data.

Once the corrected generic MR data are known, the generic distortion parameters are simply the (transformation) parameters that correlate the distorted generic MR data and the corrected generic MR data.

From the above it has become apparent that the generic distortion parameters for each set of distorted generic MR data may be determined "off-line" and stored in the database 12 of apparatus 10 depicted in FIG. 1 prior to the acquisition of the distorted MR data of the object of interest. In other words, the correction of the distorted MR data of the object of interest does not necessitate that the specific magnetic field distribution resulting from the susceptibility distribution of the object of interest has to be calculated. This facilitates and accelerates the correction of the distorted MR data of the object of interest.

Determination of the Corrected MR Data of the Object of Interest

Once the transformation parameters correlating the object of interest and the corresponding generic object as well as generic distortion parameters calculated for an appropriate gradient field strength G are known, the distorted MR data of the object of interest are calculated.

To that end appropriate generic distortion parameters are determined as illustrated above or are e.g. read out of a look up table (database 12) for a specific generic object, for a specific gradient field strength G and for a specific phase encoded direction. The generic distortion parameters are then applied to the distorted MR data of the object of interest taking additionally into account the transformation parameters correlating the object of interest (or its susceptibility distribution) and the specific generic object (or its susceptibility distribution). This allows to correct in a fast and easy manner distorted MR data of an object having an arbitrary shape using previously generated information about a generic object.

Experimental Results

Figure 5A:
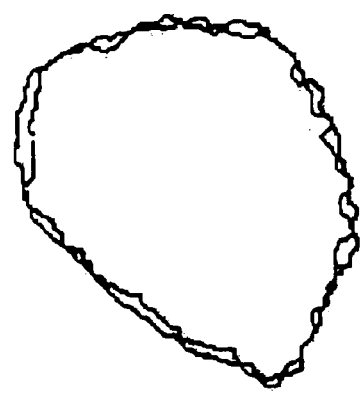
FIGS. 5A and 5B show the results of MR/CT registration using distorted MR data on the one hand and corrected MR data on the other hand.
Figure 5B:

FIGS. 5A and 5B show experimental results of an MR/CT registration. CT is an imaging technology which is considered to be free of geometrical distortions and which may thus serve as a reference standard for evaluating the correctness of MR data. CT has the additional advantage that bones and soft tissue can be easily separated by simple threshold mechanisms.

In each of FIGS. 5A and 5B two superimposed contours of a femur bone are depicted. FIG. 5A shows the contour of a femur bone as obtained by CT and a corresponding image generated using distorted MR-data. The CT image and the MR image are then registered with respect to each other. From FIG. 5A it becomes apparent that the overlaid contours do not match very well. This is mainly due to the geometry and intensity distortions inherent in the MR data.

FIG. 5B shows a similar view like FIG. 5A. However, instead of the distorted MR data corrected MR data derived as discussed above have been used. From 5B it becomes apparent that the MR image generated using the corrected MR data matches the corresponding CT image much better than in FIG. 5A.

Figure 6:
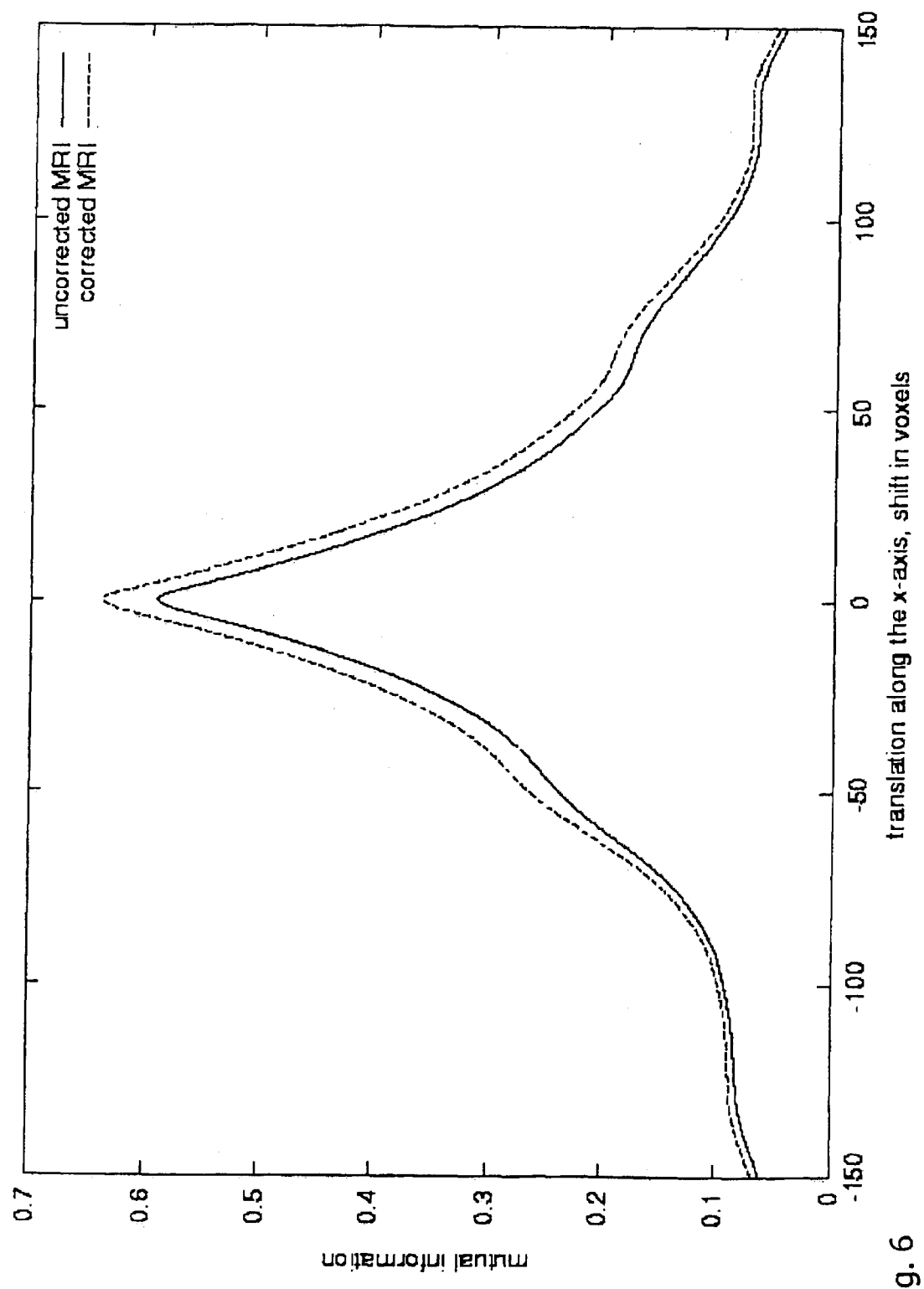
FIG. 6 shows a curve of mutual information during the MR/CT registration in a region around the global maximum.

FIG. 6 shows curves of mutual information derived for the MR/Cr registration in a region around a global maximum. A rotation around the z-axis is shown for the uncorrected (solid line) and corrected (dashed line) MR data. It becomes apparent that using corrected MR data the matching with respect to corresponding CT data is indeed improved.

"On-line" Processing of the Distorted MR Data of the Object of Interest

Figure 7:
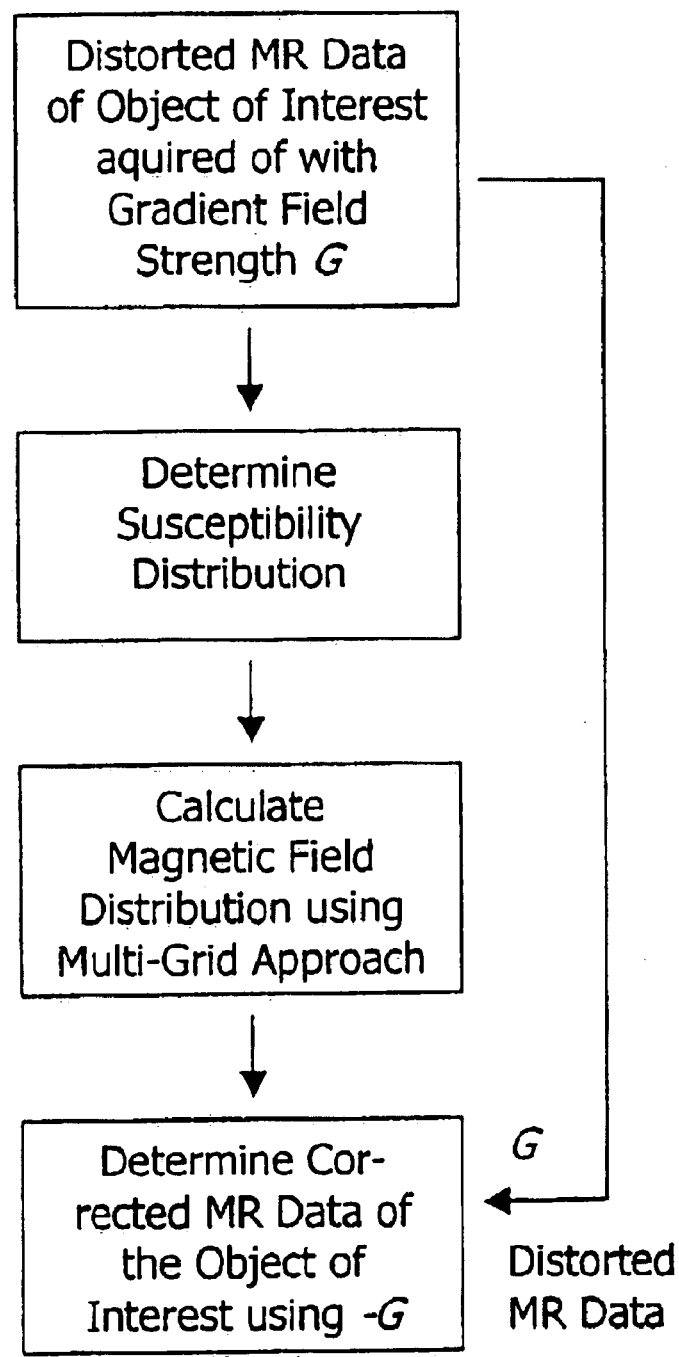
FIG. 7 is a block diagram depicting the steps performed according to the invention when applying a multi-grid algorithm to a susceptibility distribution derived for the distorted MR data of the object of interest.

In FIG. 7 a further approach according to the invention for correcting distorted MR data of an object of interest is depicted. In the approach depicted in FIG. 7, the magnetic field distribution is calculated "on-line" for the susceptibility distribution of the object of interest using the multi-grid algorithm discussed above. In principle, the determination of the corrected MR data of the object of interest is performed in the same manner as the generation of the corrected generic MR data discussed above with reference to the right branch of FIG. 2. Therefore, a more detailed description of the approach depicted in FIG. 7 is omitted.

Although compared to the approach depicted in FIG. 2 the approach depicted in FIG. 7 requires more computational time for determining the corrected MR data of the object of interest, the use of the multi-grid algorithm still considerably reduces the computational complexity compared to prior art approaches.

Use of the Invention in the Context of Computer Aided Surgery

Current three-dimensional navigation methods in e.g. bone surgery use CT or fluoroscopic imaging as a source for the three-dimensional image information which forms the basis for navigation purposes. Hitherto there have been two reasons for not using MR images. Firstly, contrary to MR images Cr images are free of distortions. Secondly, bones can easily be segmented automatically in CT-images. Due to lack of information on the cortical bone layer, an automatic segmentation is very difficult in MR images. The reason therefore is the fact that the cortical bone layer, i.e. the outer layer of the bone, has a low proton density and is thus difficult to distinguish in MR images.

According to the invention a navigation method is now proposed in which MR data which have been generated e.g. as depicted in FIG. 2 or FIG. 7 and which show the internal part of a bone (bone without cortical surface layer) are co-registered with fluoroscopic images. Co-registration requires very accurate information on the shape of the structures involved. Given the method described above for distortion correction which is applied to the distorted MR data prior to co-registration, the co-registration can advantageously be performed based on the mutual image information obtained by MR and CT.

Figure 8:
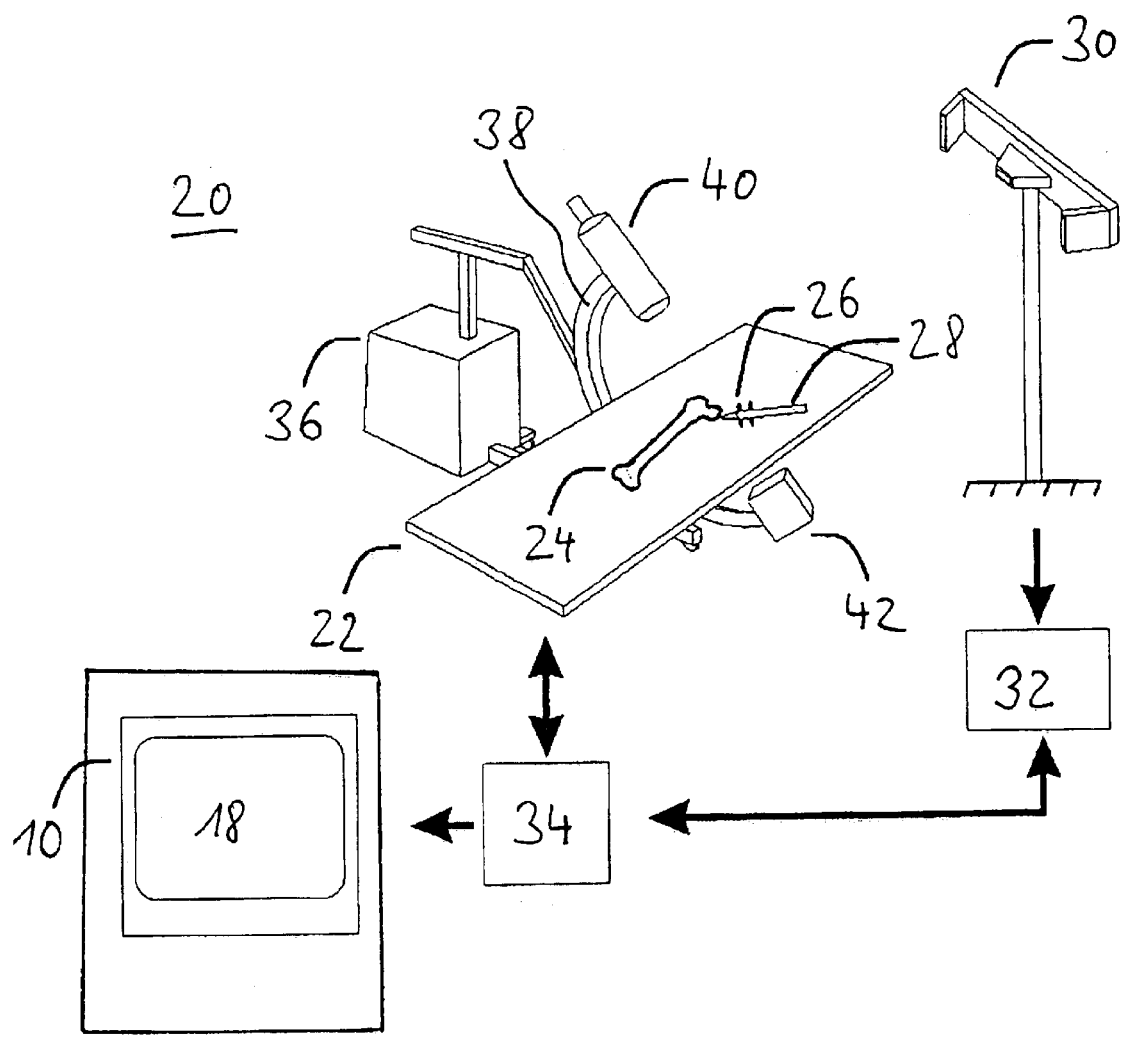
FIG. 8 shows a navigational infrastructure according to the invention.

In FIG. 8 a navigational infrastructure 20 according to the invention is depicted. As becomes apparent from FIG. 8, on an operating table 22 an anatomical object in the form of a patient's femur bone 24 to be treated operatively is disposed. The surgical intervention is performed using a surgical instrument 28 to which a marker 26 of a tracking system is attached. The marker 26 is configured to transmit e.g. infrared radiation. The infrared radiation emitted by the marker 26 is detected by an infrared detector 30 disposed in a positionally fixed manner.

A localization computer 32 calculates the current spatial position of the surgical instrument 28 from the infrared signals transmitted by the marker 26. The calculated spatial coordinates of the surgical instrument 28 are sent from the localization computer 32 via a databus to a central computer 34. The central computer 34 processes the spatial coordinates of the chirurgical instrument 28 to correlate these spatial coordinates with the corrected MR data generated by the apparatus 10 as explained above.

The apparatus 10 receives the corresponding information from the central computer 34 and displays on its display device 18 an image generated using the corrected MR data of the object of interest, i.e. the femur bone 24, and superimposes the relative position and the form of the chirurgical instrument 28 for navigational purposes.

FIG. 8 further shows an optional CT or fluoroscopic imaging system 36 having a C-shape support arm 38. Disposed at one of the two ends of the C-shaped support arm 38 is an X-ray source 40 and at the opposite end an X-ray detector 42. Two-dimensional or three-dimensional images prepared prior to or during a surgical intervention by the imaging system 36 are fed via a databus to the central computer 34 in digitized form.

With the help of the CT or fluoroscopic imaging system 36 the navigational infrastructure 20 of FIG. 8 generates CT or fluoroscopic images that are co-registered with the corresponding MR images derived from the MR data of the femur bone 24. This allows to display on the display device 18 co-registered MR and CT or fluoroscopic images simultaneously with the current position of the surgical instrument 28 with respect to the co-registered images.

What is claimed is:

1. A method of correcting distortions in magnetic resonance (MR) data, comprising:
    a) providing distorted MR data of an object of interest and distortion parameters for one or more generic objects;
    b) determining transformation parameters correlating the object of interest and one or more of the generic objects; and
    c) processing the distorted MR data taking into account the distortion parameters and the transformation parameters to obtain corrected MR data.

2. The method of claim 1, wherein the distortion parameters of a particular generic object are derived from magnetic field inhomogenities resulting from the magnetic susceptibility distribution of the generic object.

3. The method of claim 2, wherein the magnetic field inhomogenities are measured or calculated from distorted MR data of the generic object.

4. The method of claim 3, wherein calculating the magnetic field inhomogenities includes determining the magnetic susceptibility distribution of the generic object from the distorted NR data of the generic object and deriving the magnetic field inhomogenities from the determined susceptibility distribution using a multi-grid approach.

5. The method of claim 1, wherein in step b) the transformation parameters are determined on the basis of magnetic susceptibility data of the object of interest which are derived from the distorted MR data.

6. The method of claim 1, wherein step b) includes:
    processing the distorted MR data to identify at least one region of common or changing magnetic susceptibility; and
    determining the transformation parameters that deform the at least one region determined from the distorted MR data onto a corresponding region of one or more of the generic objects.

7. The method of claim 1, wherein step c) includes:
    calculating distortion parameters for the object of interest taking into account the distortion parameters for the one or more generic objects and the transformation parameters; and
    reverse-applying the distortion parameters for the object of interest to the distorted MR data of the object of interest or to data derived therefrom.

8. The method of claim 1, wherein in step a) for a particular generic object several sets of distortion parameters for different gradient field strengths are provided and wherein for step c) this set of distortion parameters is selected which corresponds to the gradient field strength that was used while generating the distorted MR data of the object of interest.

9. The method of claim 1, further comprising determining the gradient field strength that was used while generating the distorted MR data of the object of interest by co-generating MR data of a phantom object.

10. The method of claim 1, wherein MR data of the phantom object are co-generated to redundantly verify the correction of the distorted MR data of the object of interest.

11. The method of claim 1, wherein for one and the same object of interest steps a) to c) are repeated at least once at different points in time to detect chronological changes of the object of interest.

12. The method of claim 11, wherein MR data generated for one and the same object of interest at different points in time are registered relative to each other.

13. The method of claim 11, further comprising providing computer tomography (CT) or fluoroscopic data of the object of interest and registering the CT or fluoroscopic data and the corrected MR data of the object of interest relative to each other.

14. The method of claim 1, further comprising generating a graphical display of the corrected MR data or of data derived therefrom, determining the current position of at least one of a surgical tool and a pointer with respect to the MR data or the data derived therefrom, and superimposing the current position on the graphical display.

15. The method of claim 1, further comprising:
    d) using the corrected MR data for navigation in bone surgery.

16. A computer program product comprising program code portions for performing the steps of claim 1 when the computer program product is run on a computer system.

17. The computer program product of claim 16, stored on a computer readable recording medium.

18. An apparatus for correcting distortions in magnetic resonance (MR) data, comprising:
    a common database or separate databases for at least temporarily storing distorted MR data of a object of interest and distortion parameters for one or more generic objects;
    a unit for generating transformation parameters correlating the object of interest and one or more of the generic objects; and
    a unit for processing the distorted MR data taking into account the distortion parameters and the transformation parameters to obtain corrected MR data.

* * * * *